United States Patent
Yang

(10) Patent No.: US 8,040,193 B2
(45) Date of Patent: Oct. 18, 2011

(54) OSCILLATION ADJUSTING CIRCUIT AND METHOD

(75) Inventor: Chih-Wei Yang, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 529 days.

(21) Appl. No.: 12/218,884

(22) Filed: Jul. 18, 2008

(65) Prior Publication Data
US 2009/0228746 A1    Sep. 10, 2009

(30) Foreign Application Priority Data

Mar. 6, 2008   (TW) ................................ 97107824 A

(51) Int. Cl.
*H03L 7/085* (2006.01)
*G06F 1/04* (2006.01)

(52) U.S. Cl. ............. 331/18; 331/25; 331/1 A; 375/376; 327/159; 713/500; 713/501

(58) Field of Classification Search .................. 713/400, 713/401, 500, 501, 502, 503, 600; 331/18, 331/25, 1 A; 375/373, 375, 376; 327/156, 159

See application file for complete search history.

(56) References Cited

U.S. PATENT DOCUMENTS

| | | | |
|---|---|---|---|
| 6,670,852 B1 | 12/2003 | Hauck ........................... 331/1 A |
| 7,093,151 B1 | 8/2006 | Williams ....................... 713/500 |
| 2006/0023824 A1* | 2/2006 | Greco et al. .................. 375/371 |
| 2007/0216487 A1* | 9/2007 | Yang et al. .................... 331/1 A |

* cited by examiner

*Primary Examiner* — Ryan Johnson
(74) *Attorney, Agent, or Firm* — Haverstock & Owens LLP

(57) ABSTRACT

An oscillation tuning circuit is provided and includes a first circuit. The first circuit receives an input data stream with a known time interval, producing a first output signal having a first period, determines a first error signal representing a difference between the known time interval and a measured duration of the known time interval, determines a reference error signal according to a predetermined multiple of the first period, and adjusts the first period according to the first error signal and the reference error signal, wherein the known time interval is associated with a period between a first occurrence of and a second occurrence of a predetermined bit pattern in the input data stream.

20 Claims, 9 Drawing Sheets

OSCILLATION ADJUSTING CIRCUIT AND METHOD

FIELD OF THE INVENTION

The present invention relates to an oscillation adjusting circuit and method, and more particularly to an oscillation adjusting circuit and method for applying to data transmission.

BACKGROUND OF THE INVENTION

An oscillation adjusting circuit may effectively be applied to a data transmission system, e.g. a Universal Serial Bus (USB) interface, a micro control unit (MCU), or a communication system, with bit-rate or clock synchronization and utilizes exact data clock synchronization control to ensure the correctness and the stability during the data packet transmission. Taking the full speed specification of the USB version 1.1 as an example on condition that the external crystal oscillator is not used, a mechanism of an internal circuit loop of the oscillation adjusting circuit is utilized to automatically detect and calibrate the oscillation frequency of the receiver device, so that the internal clock of the receiver can be synchronized with the reference data stream of the host.

The advantages utilizing the oscillation adjusting circuit are as follows. (1) The system may still be made to stably transmit data on condition that a highly exact external device (e.g. crystal oscillator) is not used. (2) The number of the pins of the integrated circuit may be saved, and the occupation space, on the layout surface of the system board, of the external device (e.g. crystal oscillator) may also be saved, so that the cost may be effectively reduced.

In the aspect of the circuit design, a conventional oscillation adjusting circuit adopts the architecture of the phase-locked loop (PLL) and/or the phase-delayed loop (DLL). Taking the data transmission specification of the USB as an example, the disadvantages of the architecture are as follows. (1) The conventional PLL or DLL requires a longer and sequential input reference clock to reach the lock. (2) It requires a lengthy locking time. (3) It requires an exact frequency-lock circuit configuration, or the error of the clock is easily formed. Based on the above reasons, the PLL or DLL is not very suitable for the transmission system of the USB.

The U.S. Pat. No. 6,670,852 discloses the prior art illustrating an oscillation adjusting circuit including a first circuit and a second circuit. The first circuit is configured to generate an output signal oscillating at a first frequency in response to a first control signal. The second circuit is configured to receive a calibration signal oscillating at a second frequency and generate the first control signal in response to a counter value when in a first mode and a stored value when in a second mode, wherein, while in the first mode, the counter value is adjusted in response to a difference between the first frequency and the second frequency.

The U.S. Pat. No. 7,093,151 discloses the prior art illustrating an oscillation adjusting circuit including a first circuit. The first circuit is configured to receive an input data stream, generate an output having a first frequency and adjust the first frequency in response to a measured duration of a known time interval associated with a period between a first occurrence of a predefined bit pattern and a second occurrence of the predefined bit pattern in the input data stream. This prior art requires a large lock-up table to memorize, adjust, and calibrate the internal frequency of the first circuit.

In order that the oscillation adjusting circuit does not use the external crystal and the lock-up table for reducing the chip area, saving the component cost, and providing good selectivity on the wide frequency domain of the communication transmission, a more effective oscillation adjusting circuit is required.

SUMMARY OF THE INVENTION

It is an object of the present invention to provide an oscillation adjusting circuit and method. An error signal and a reference error signal are determined and used to adjust an oscillation period of an output signal of the circuit for reducing the chip area, saving the component cost, and providing good selectivity on the wide frequency domain of the communication transmission.

It is therefore a first aspect of the present invention to provide an oscillation adjusting circuit including a first circuit. The first circuit receives an input data stream with a known time interval, produces an output signal having a first period, determines a first error signal representing a difference between the known time interval and a measured duration of the known time interval, determines a reference error signal according to a predetermined multiple of the first period, and adjusts the first period according to the first error signal and the reference error signal, wherein the known time interval is associated with a period between a first occurrence of and a second occurrence of a predetermined bit pattern in the input data stream.

It is therefore a second aspect of the present invention to provide an oscillation adjusting method for producing an output signal having a first period. The method includes the following steps. An input data stream with a known time interval is provided, wherein the known time interval is associated with a period between a first occurrence of and a second occurrence of a predetermined bit pattern in the input data stream. A first error signal representing a difference between the known time interval and a measured duration of the known time interval is determined. A reference error signal is determined according to a predetermined multiple of the first period. And, the first period is adjusted according to the first error signal and the reference error signal.

It is therefore a third aspect of the present invention to provide an oscillation adjusting circuit including an oscillator, a timing comparator, and an error processing circuit. The oscillator produces an output signal having a first period. The timing comparator receives the output signal and an input data stream with a known time interval, produces a first error signal representing a difference between the known time interval and a measured duration of the known time interval, and produces a reference error signal according to a predetermined multiple of the first period, wherein the known time interval is associated with a period between a first occurrence of and a second occurrence of a predetermined bit pattern in the input data stream. The error processing circuit receives the first error signal and the reference error signal and produces a control signal adjusting the first period according to the first error signal and the reference error signal.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
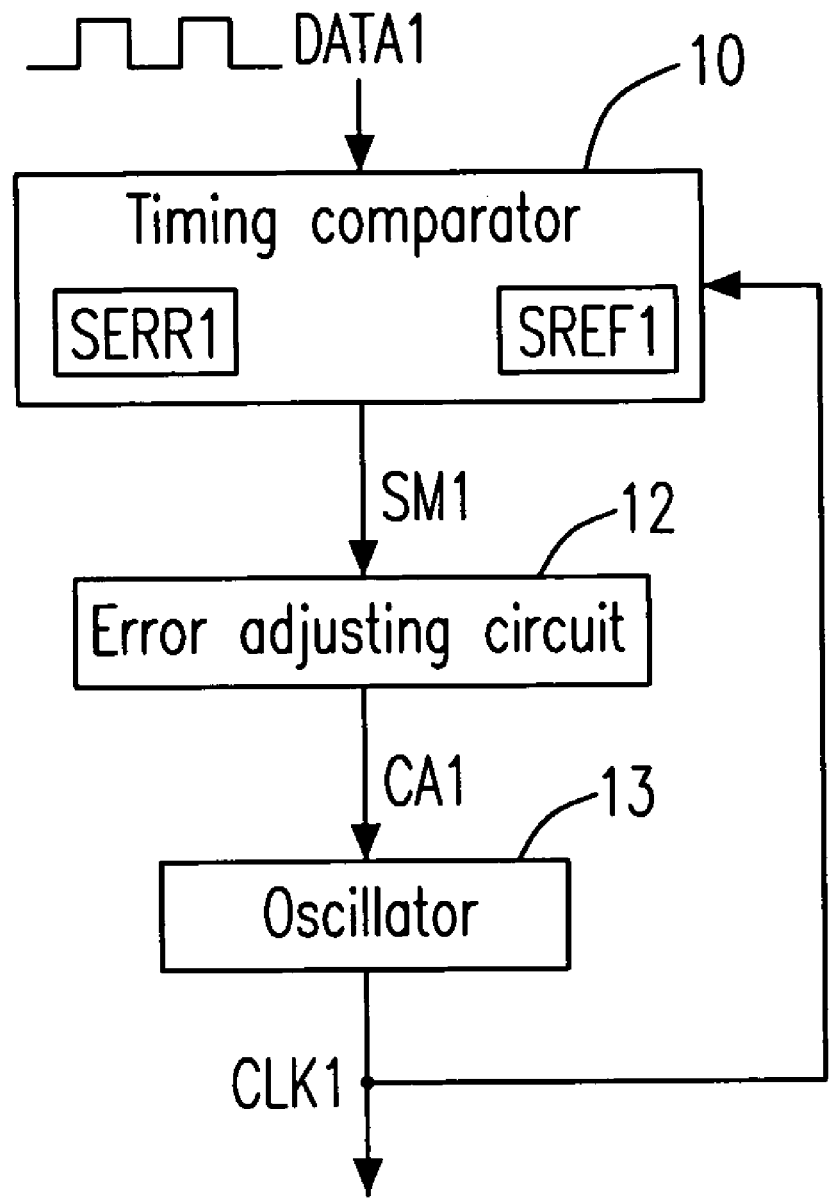
FIG. 1 is a schematic diagram showing an oscillation adjusting circuit according to the first embodiment of the present invention.

Please refer to FIG. 1, which is a schematic diagram showing an oscillation adjusting circuit according to the first embodiment of the present invention. As shown, the oscillation adjusting circuit 91 includes an oscillator 13, a timing comparator 10, and an error adjusting circuit 12, wherein the oscillation adjusting circuit 91 may be inside a receiver (not shown) at a receiving terminal. The oscillator 13 produces an output signal CLK1 having a first period, wherein the first period is a reciprocal of a first frequency of the output signal CLK1.

The timing comparator 10 receives the output signal CLK1 and an input data stream DATA1 with a known time interval, determines an error signal SERR1 representing a difference between the known time interval and a measured duration of the known time interval, determines a reference error signal SREF1 according to a predetermined multiple of the first period, and compares the first error signal SERR1 with the reference error signal SREF1 for producing a comparison result signal SM1, wherein the input data stream DATA1 may be provided by a transceiver (not shown) at a transmitting terminal, and the known time interval is associated with a period between a first occurrence of and a second occurrence of a predetermined bit pattern in the input data stream DATA1.

The error adjusting circuit 12 receives the comparison result signal SM1 and produces a control signal CA1 according to the comparison result signal SM1, wherein the control signal CA1 includes a quantized value transformed from the comparison result signal SM1. The control signal CA1 is provided to the oscillator 13, and the oscillator 13 adjusts the first period of the output signal CLK1 according to the control signal CA1. The first frequency of the output signal CLK1 will approach and be locked to a second frequency of the input data stream DATA1, wherein the second frequency is a reciprocal of the known time interval. Taking the full speed specification of the USB version 1.1 as an example, the error rate representing a difference between the first frequency and the second frequency (host data rate) will be kept to be within 0.25% of the host data rate.

Figure 2:
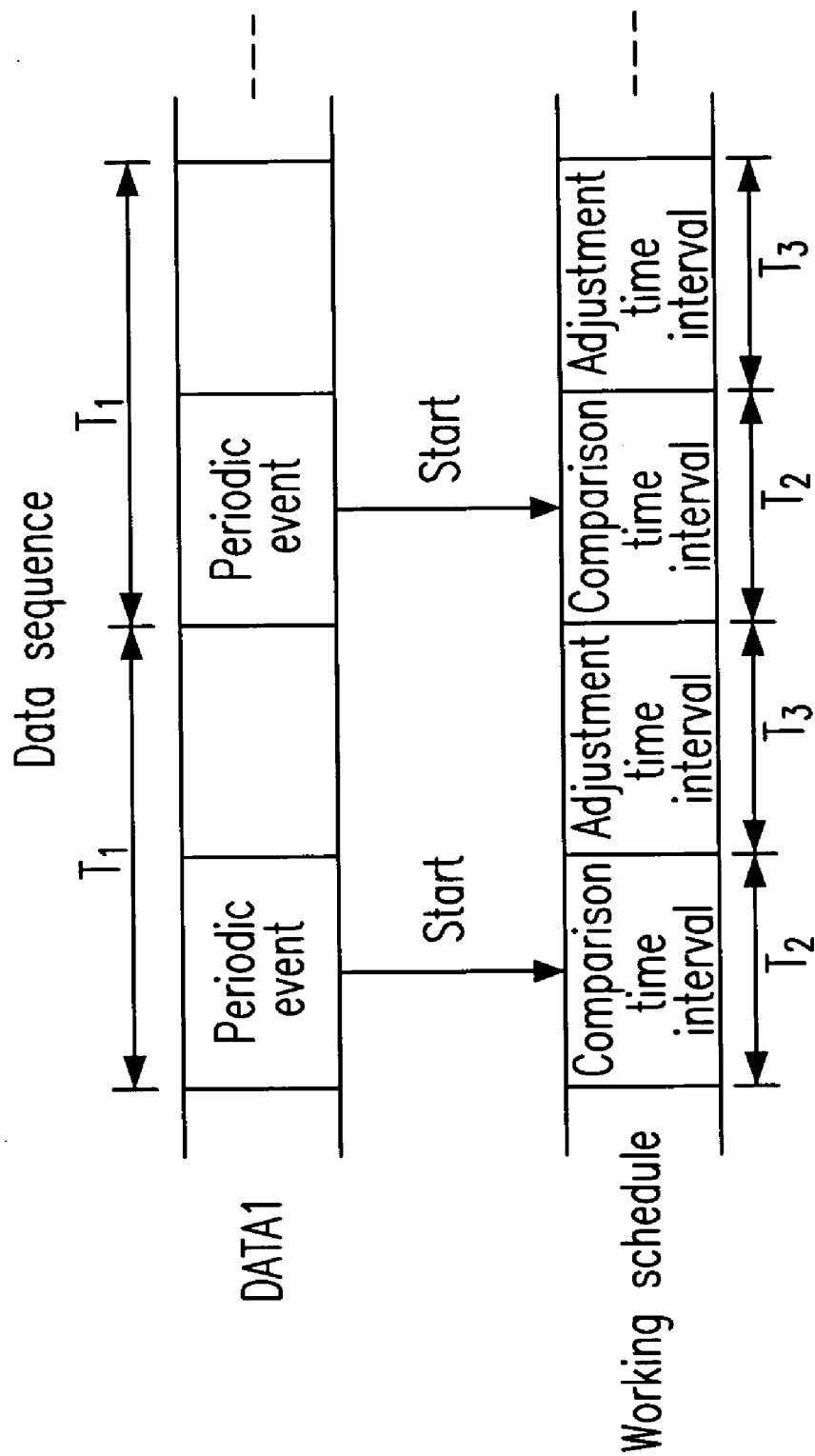
FIG. 2 is a schematic diagram showing a working schedule of the oscillation adjusting circuit according to the first embodiment of the present invention.

Please refer to FIG. 2, which is a schematic diagram showing a working schedule of the oscillation adjusting circuit according to the first embodiment of the present invention. FIG. 2 shows the input data stream DATA1 sent by the transceiver and a periodic working schedule of the receiver. The scheme of FIG. 2 is applied to synchronize the output signal CLK1 with the input data stream DATA1 and may be used in a manner of locking the bit rate or locking the clock. The input data stream DATA1 includes one or more known time intervals $T_1$. The known time intervals $T_1$ are delimited by periodic events in the input data stream DATA1 and particularly delimited by successive periodic events. The periodic events include start-of-frame (SOF) packets of a Universal Serial Bus (USB) protocol. The periodic working schedule includes a comparison time interval $T_2$ and an adjustment time interval $T_3$. Each time the periodic event appears on the input data stream DATA1, the periodic working schedule is made to start for obtaining the timing error by comparing the output signal CLK1 with the input data stream DATA1. Then the timing adjustment is performed to correct the first frequency of the output signal CLK1 for making the output signal CLK1 synchronized with the input data stream DATA1.

Figure 3:
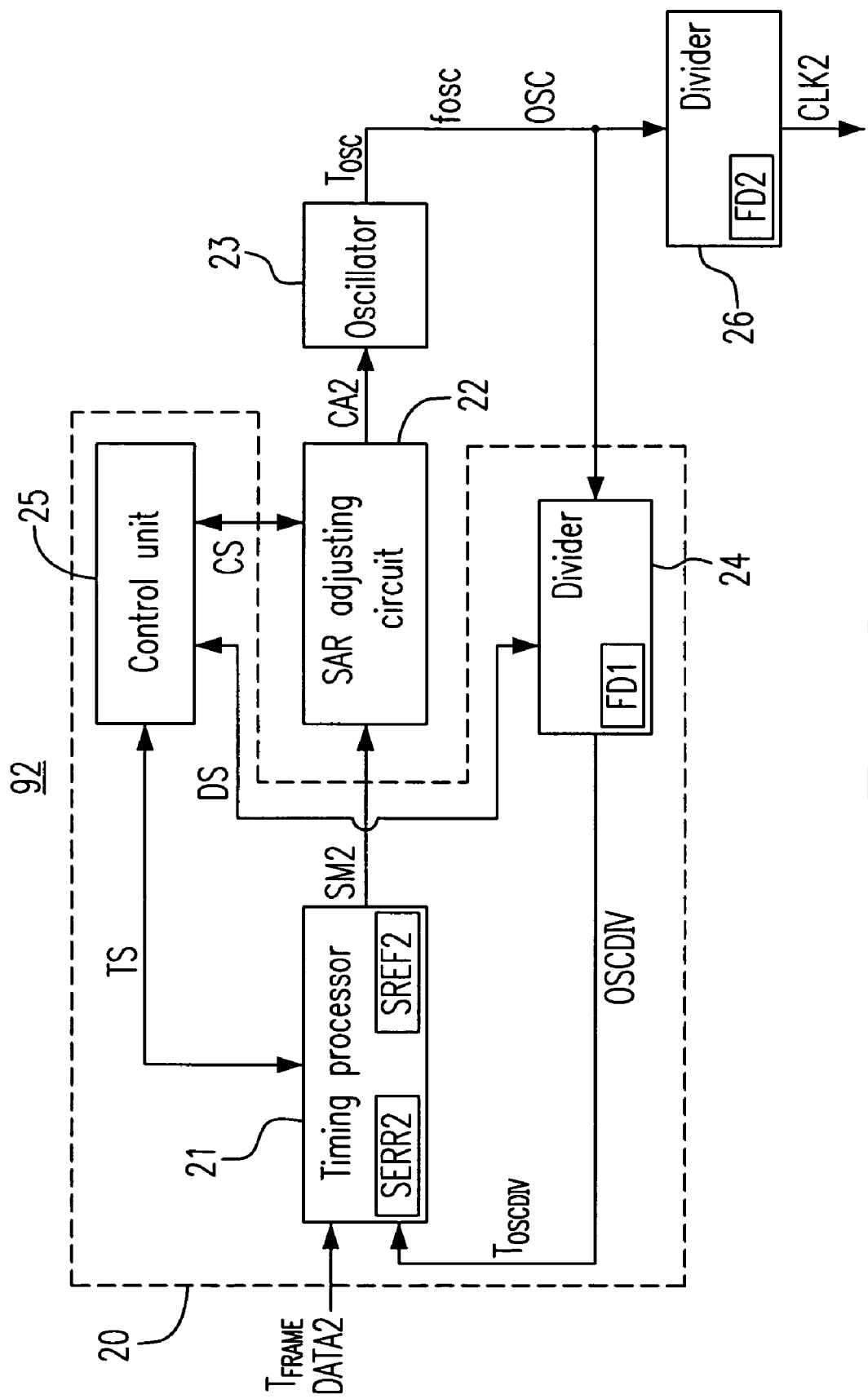
FIG. 3 is a schematic diagram showing an oscillation adjusting circuit according to the second embodiment of the present invention.

Please refer to FIG. 3, which is a schematic diagram showing an oscillation adjusting circuit according to the second embodiment of the present invention. As shown, the oscillation adjusting circuit 92 includes a timing comparator 20, a successive approximation register (SAR) adjusting circuit 22, an oscillator 23, and a divider 26, wherein the timing comparator 20 includes a timing processor 21, a control unit 25, and a divider 24. The control unit 25 is coupled to the timing processor 21, the SAR adjusting circuit 22, and the divider 24 and controls the operation of the timing processor 21, the SAR adjusting circuit 22, and the divider 24. There is a signal TS between the control unit 25 and the timing processor 21. There is a signal CS between the control unit 25 and the SAR adjusting circuit 22. There is a signal DS between the control unit 25 and the divider 24.

The oscillator 23 produces an output signal OSC having a period $T_{OSC}$, wherein the period $T_{OSC}$ is a reciprocal of a frequency $f_{OCS}$ of the output signal OSC. The divider 24 has a frequency divisor FD1, receives the output signal OSC, and produces a frequency division signal OSCDIV according to the output signal OSC and the frequency divisor FD1 under the control of the control unit 25.

The timing processor 21 receives the frequency division signal OSCDIV and an input data stream DATA2 with a known time interval $T_{FRAME}$. When the control unit 25 and the timing processor 21 find a periodic event by detecting the input data stream DATA2, the control unit 25 triggers the divider 24 to magnify the clock pulse period (the error of the clock pulse period is also magnified therewith). Therefore, the frequency division signal OSCDIV is made to include a measured duration $T_{OSCDIV}$ corresponding to the known time interval $T_{FRAME}$, wherein during the circuit design, a relation representing a multiple between the known time interval $T_{FRAME}$ and the period $T_{OSC}$ is required to be calculated for determining the frequency divisor FD1 of the divider 24. The timing processor 21 determines an error signal SERR2 representing a difference between the known time interval $T_{FRAME}$ and the measured duration $T_{OSCDIV}$, determines a reference error signal SREF2 according to a predetermined multiple of the period $T_{OSC}$, and compares the error signal SERR2 with the reference error signal SREF2 for producing a comparison result signal SM2.

The SAR adjusting circuit 22 being an configuration of the error adjusting circuit 12 receives the comparison result signal SM2 and produces a control signal CA2 according to the comparison result signal SM2 and a binary search operation, wherein the control signal CA2 includes a quantized value transformed from the comparison result signal SM2. This embodiment adopts the SAR adjusting circuit 22, which causes that the comparison result signal SM2 merely requires to include data whether the frequency needs to be adjusted and is adjusted up or down. Therefore, it is unnecessary to use the large lock-up table to memorize and know the exact error value, and it is also unnecessary to map the values required to be adjusted according to the large lock-up table, so that the design complexity of the circuit component and the chip area are reduced. Each time the periodic event appears; the SAR adjusting circuit 22 can produce the control signal CA2 according to the comparison result signal SM2. The oscillator 23 receives the control signal CA2 and adjusts the frequency $f_{OSC}$ of the output signal OSC according to the control signal CA2, so that the error representing a difference between the known time interval $T_{FRAME}$ and the measured duration $T_{OSCDIV}$ will be successively decreased by one-half to approach to zero.

The divider 26 has a frequency divisor FD2, receives the output signal OSC, and produces an output signal CLK2 according to the output signal OSC and the frequency divisor FD2. When the error between the known time interval $T_{FRAME}$ and the measured duration $T_{OSCDIV}$ approaches to zero, the frequency of the output signal CLK2 may be approached to that of the input data stream DATA2, which makes the two signals CLK2 and DATA2 be synchronous.

Figure 4:
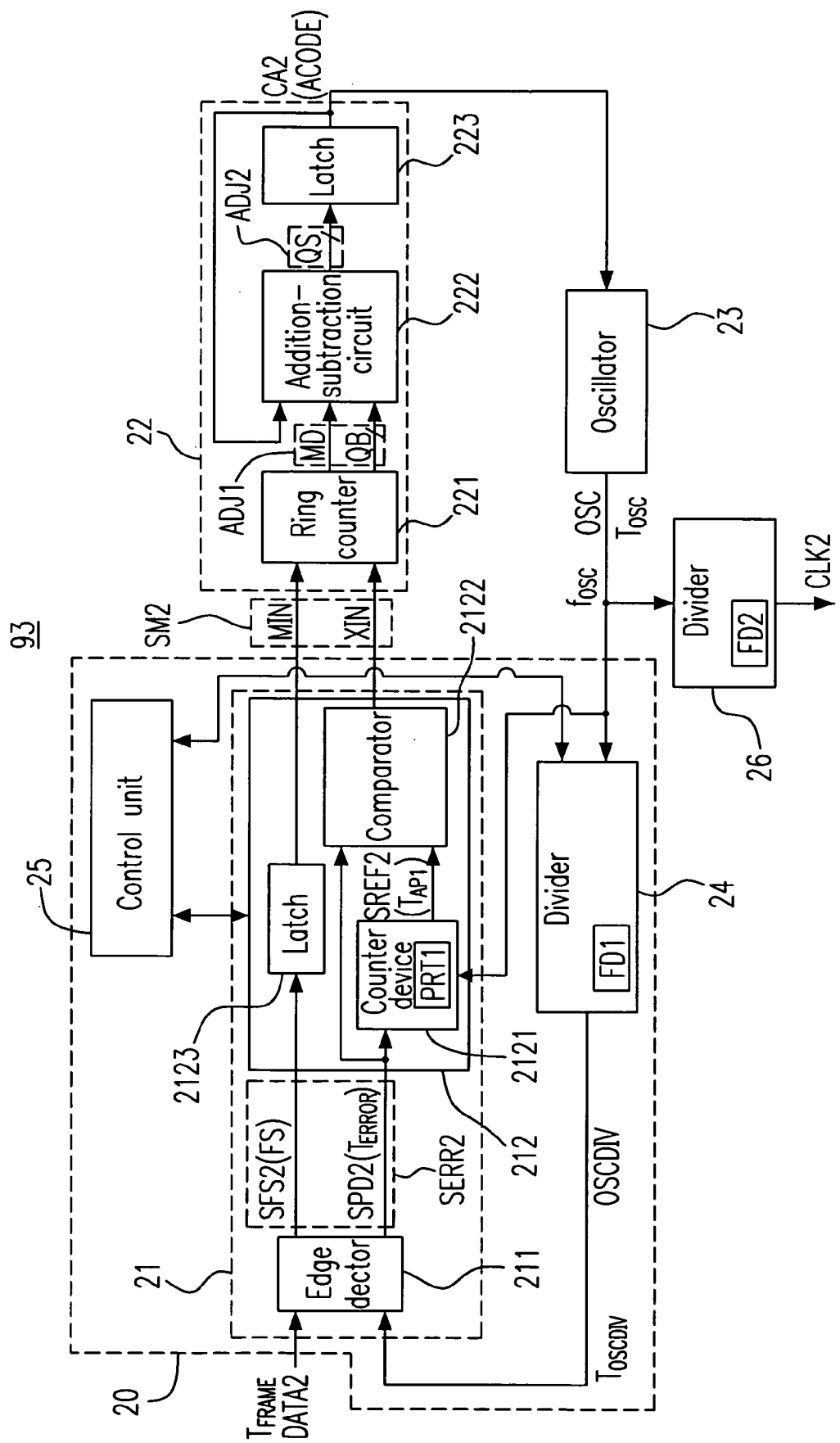
FIG. 4 is a schematic diagram showing an oscillation adjusting circuit according to the third embodiment of the present invention.

Please refer to FIG. 4, which is a schematic diagram showing an oscillation adjusting circuit according to the third embodiment of the present invention. The oscillation adjusting circuit 93 depicts the detail of the oscillation adjusting circuit 92 in FIG. 2, wherein the repetitive descriptions are omitted. As shown in FIG. 4, the timing processor 21 includes an edge detector 211 and an error comparator 212.

The edge detector 211 is coupled to the control unit 25, is controlled by the control unit 25, receives the input data stream DATA2 and the frequency division signal OSCDIV, detects pulse edges of the input data stream DATA2 and pulse edges of the frequency division signal OSCDIV, determines a first starting and a first ending time points of the known time interval $T_{FRAME}$ and a second starting and a second ending time points of the measured duration $T_{OSCDIV}$ for producing an error signal SERR2 including an error time interval signal SPD2 and a fast-slow signal SFS2, wherein the error time interval signal SPD2 has an error time interval $T_{ERROR}$ and the fast-slow signal SFS2 has a fast-slow relation value FS.

The edge detector 211 utilizes the detection of the pulse edges of the input data stream DATA2 to detect the predetermined bit pattern in the input data stream DATA2 for determining the first starting and the first ending time points of the known time interval $T_{FRAME}$. Taking the full speed specification of the USB version 1.1 as an example, the edge detector detects the SOF packet.

The error comparator 212 is coupled to the control unit 25, is controlled by the control unit 25, has a predetermined multiple PRT1, receives the output signal OSC and the error signal SERR2, is triggered by the output signal OSC for counting the predetermined multiple PRT1 to produce the reference error signal SREF2 having a reference error time interval $T_{AP1}$, and produces a comparison result signal SM2 according to the error signal SERR2 and the reference error signal SREF2.

The error comparator 212 includes a counter device 2121, a comparator 2122, and a latch 2133. The counter device 2121 has the predetermined multiple PRT1, receives the error signal SERR2 and the output signal OSC, and produces the reference error signal SREF2 according to the predetermined multiple PRT1, the output signal OSC, and a starting time point of the error time interval $T_{ERROR}$. The comparator 2122 receives the error time interval signal SPD2 and the reference error signal SREF2 and compares the reference error time interval $T_{AP1}$ with the error time interval $T_{ERROR}$, wherein when the error time interval $T_{ERROR}$ is longer than the reference error time interval $T_{AP1}$, the SAR adjusting circuit 22 adjusts the oscillator 23 for making the error time interval $T_{ERROR}$ shorter than the reference error time interval $T_{AP1}$. The latch 2123 receives the fast-slow signal SFS2 and latches the fast-slow relation value FS for producing an identification value MIN of the comparison result signal SM2.

The SAR adjusting circuit 22 includes a ring counter 221, an addition-subtraction circuit 222, and a latch 223. The ring counter 221 receives the comparison result signal SM2 and produces an adjusting signal ADJ1 according to the comparison result signal SM2. The addition-subtraction circuit 222 receives the control signal CA2 and the adjusting signal ADJ1 and utilizes the adjusting signal ADJ1 to adjust the control signal CA2 for producing an adjusting signal ADJ2. The latch 223 receives the adjusting signal ADJ2 and latches the adjusting signal ADJ2 for producing the control signal CA2.

Figure 5:
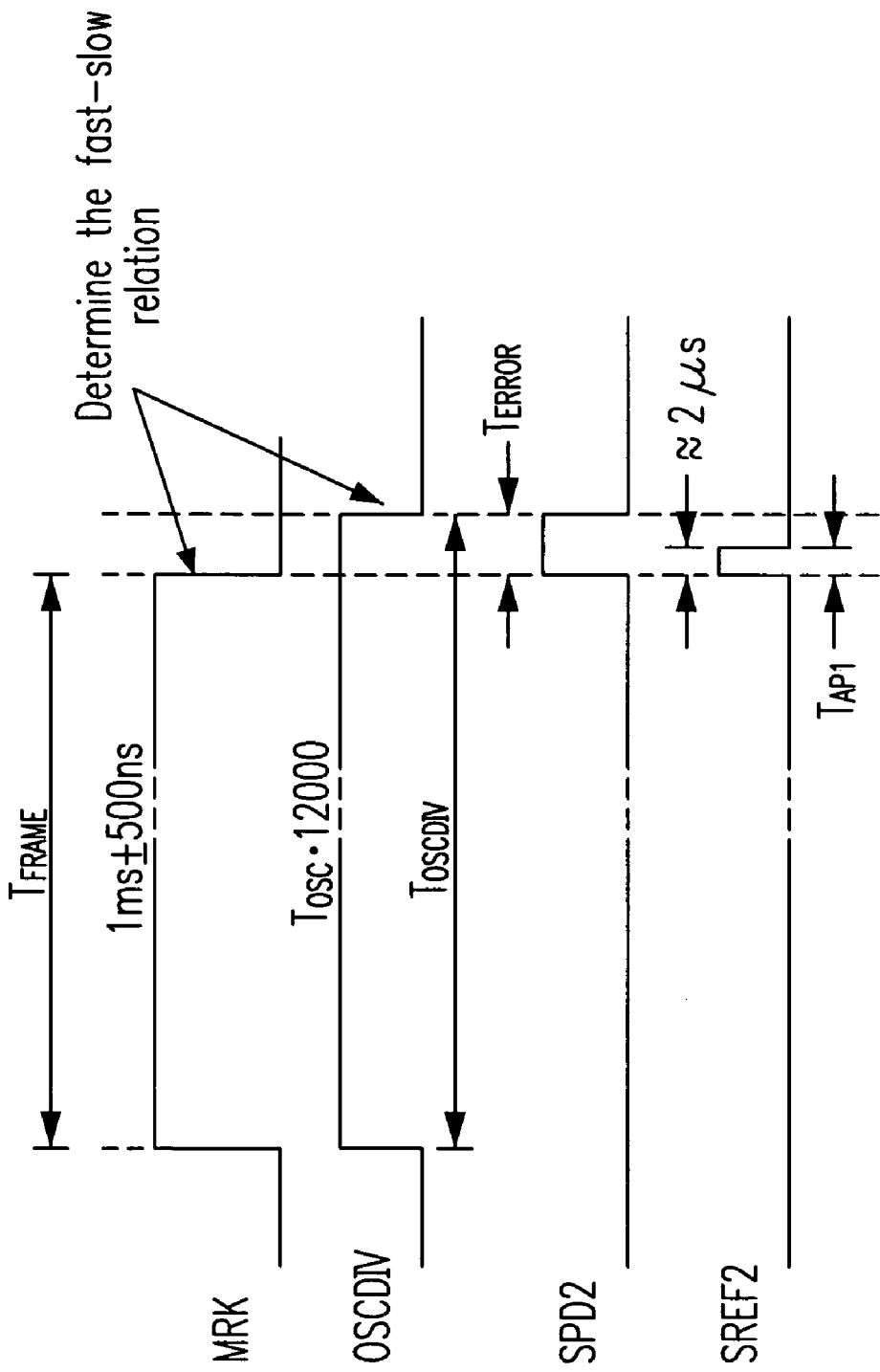
FIG. 5 is a schematic diagram showing signals of the oscillation adjusting circuit according to the third embodiment of the present invention.

Here, the operation of the oscillation adjusting circuit 93 in FIG. 4 is described through a practical example used in the full speed specification of the USB version 1.1. Please refer to FIG. 5, which is a schematic diagram showing signals of the oscillation adjusting circuit according to the third embodiment of the present invention. FIG. 5 shows the signals of a marking signal MRK with the known time interval $T_{FRAME}$, the frequency division signal OSCDIV, the error time interval signal SPD2, and the reference error signal SREF2. When the USB receiver is coupled to the USB host, the USB receiver receives the input data stream DATA2 provided by the USB host. It may be known that the input data stream DATA2 includes information of the exact known time interval $T_{FRAME}$, being 1 ms±500 ns, marking the period of the periodic events therein according to the full speed specification of the USB version 1.1, wherein ±500 ns is the error value probably happening to the known time interval $T_{FRAME}$; i.e., the error rate is ±0.05%.

The known time interval $T_{FRAME}$ is represented by a time interval of a pulse in the marking signal MRK. When the edge detector 211 and the control unit 25 detect to get the periodic event, the control unit 25 can notice the divider 24 to frequency-divide the received output signal OSC, wherein the frequency divisor FD1 of the divider 24 is set as 12000. The frequency $f_{OSC}$ of the output signal OSC here is designed to be 12 MHz±5%, wherein the ±5% is the probable error rate when the oscillator 23 starts oscillating. The probable error rate is averaged and magnified 12000 times through the frequency division of the divider 24. Therefore, the frequency division signal OSCDIV with the measured duration $T_{OSCDIV}$ ($T_{OSCDIV}=T_{OSC} \cdot 12000$) is produced, wherein $T_{OSC}$ is the period of the output signal OSC, and the measured duration $T_{OSCDIV}$ is also marked by a pulse duration.

The edge detector 211 receives the input data stream DATA2 and the frequency division signal OSCDIV. Under the control of the control unit 25, the edge detector 211 produces the marking signal MRK with the known time interval $T_{FRAME}$, determines an error time interval $T_{ERROR}$ ($T_{ERROR}=|T_{OSCDIV}-T_{FRAME}|$) representing a difference between the rising edge (starting time point) of the known time interval $T_{FRAME}$ and the falling edge (ending time point) of the measured duration $T_{OSCDIV}$, and determines a fast-slow relation value FS representing a fast-slow relation between the known time interval $T_{FRAME}$ and the measured duration $T_{OSCDIV}$. The detection of the rising edges is omitted by reason that after the rising edge (starting time point) of the known time interval $T_{FRAME}$ happens, the rising edge (starting time point) of the frequency division signal OSCDIV happens immediately. The maximum error between the two rising edges is one period $T_{OSC}$, i.e., the corresponding maximum error rate is only 1/12000=0.0083% and may be negligible with respect to the error rate ±0.25% of the specification. Therefore, the two starting time points of the rising edges can be considered as coincidence and the detection of the falling edges is merely performed.

Afterward, the error time interval $T_{ERROR}$ and the fast-slow relation value FS are provided to the error comparator 212 for comparison, wherein the counter device 2121 of the error comparator 212 has the predetermined multiple PRT1 representing a counting number the value of which is 24. Under the present condition, the error comparator 212 depends on the falling edge of the known time interval $T_{FRAME}$ or the falling edge of the measured duration $T_{OSCDIV}$ to trigger the counter device 2121 and makes the counter device 2121 start to count for producing a reference error time interval $T_{REFA2}$ ($T_{REFA2}=T_{OSC}\cdot24$) of about 2 µs, wherein the reference error time interval $T_{REFA2}$ is an error standard value.

The error time interval $T_{ERROR}$ and the reference error time interval $T_{REFA2}$ are provided to the comparator 2122 of the error comparator 212 for comparing the time interval lengths thereof for producing an identification value XIN of the comparison result signal SM2. When the error time interval $T_{ERROR}$ is longer than the reference error time interval $T_{REFA2}$, the identification value XIN is set as 0, which denotes that to adjust the frequency $f_{OSC}$ of the output signal OSC is necessary. When the error time interval $T_{ERROR}$ is shorter than the reference error time interval $T_{REFA2}$, the identification value XIN is set as 1, which denotes that to adjust the frequency $f_{OSC}$ of the output signal OSC is unnecessary. The formula determining the identification value XIN is expressed as follows. $W=T_{ERROR}-T_{REFA2}=|T_{OSC}\cdot12000-T_{FRAME}|-T_{OSC}\cdot24$; when W>0, then XIN=0; when W≦0, then XIN=1.

It is noted that the value selected for the predetermined multiple PRT1 of the counter device 2121 is 24, and the factors determining the value are described as follows. The accuracy demanded by the full speed specification of the USB version 1.1 is ±0.25%. The rate of variation of the known time interval $T_{FRAME}$ at the USB host is about ±0.05%. Therefore, the designed error rate of the frequency $f_{OSC}$ of the output signal OSC of the oscillation adjusting circuit 93 must be locked within ±0.20%. The period $T_{OSC}$ of the output signal OSC is 83.33 ns(1/12 MHz). To count the period $T_{OSC}$ 24 times can obtain a time interval approaching a time interval of 2 µs, and the ratio of the time interval 2 µs to the time interval 1 ms is 0.2%. Besides, there can be a doubtful point if the reference error time interval $T_{REFA2}$ (2 µs) of the output signal OSC is taken as an error standard value. The period $T_{OSC}$ of the output signal OSC is inaccurate and the rate of error variation is ±5% therein, so that the rate of the error variation of the reference error time interval $T_{REFA2}$ (2 µs) is also ±5%. However, the doubtful point is not a problem. Suppose that the period $T_{OSC}$ of the output signal OSC has an error rate of 5%. As shown, the divider 24 can enlarge the error of the output signal OSC to 12000 times. Therefore, the error rate (5%·12000) of the error time interval $T_{ERROR}$ can be much larger than the error rate (5%·24) of the reference error time interval $T_{REFA2}$. After adjusting the oscillator 23 one by one through feeding back, the error of the period $T_{OSC}$ of the output signal OSC can be lowered gradually, and the reference error time interval $T_{REFA2}$ is also lowered to be a time interval of 2 µs.

The fast-slow relation value FS is provided to the latch 2123 of the error comparator 212. The error comparator 212 uses the latch 2123 to latch the fast-slow relation value FS and to produce the identification value MIN of the comparison result signal SM2. When the identification value MIN is equal to 0, it is indicated that the frequency $f_{OSC}$ of the output signal OSC is too low and must be increased. When the identification value MIN is equal to 1, it is indicated that the frequency $f_{OSC}$ of the output signal OSC is too fast and must be lowered. The identification values XIN and MIN of the comparison result signal SM2 are provided to the SAR adjusting circuit 22 for controlling the calibration of the frequency $f_{OSC}$. The relation among the identification values XIN and MIN and a frequency state is shown in Table 1 as follows.

TABLE 1

| XIN | MIN | Frequency state |
|---|---|---|
| 0 | 0 | Frequency increased |
| 0 | 1 | Frequency lowered |
| 1 | 0 | Frequency unchanged |
| 1 | 1 | Frequency unchanged |

As the SAR adjusting circuit 22 is used to control the calibration of the frequency $f_{OSC}$ in the present embodiment, it only requires to obtain information the frequency $f_{OSC}$ of the output signal OSC is too fast, too low, or appropriate (within the error rate of ±0.2%). And, the identification values XIN and MIN provided by the error comparator 212 are sufficient to indicate the above information. The SAR adjusting circuit 22 further includes a ring counter 221, an addition-subtraction circuit 222, and a latch 223, and the principal goal of the SAR adjusting circuit 22 is to convert the identification values XIN and MIN into the control signal CA2. In order to make the calibration of the frequency $f_{OSC}$ have sufficient accuracy, it is necessary that the count of bits of a quantized value ACODE of the control signal CA2 is sufficient.

Figure 6:
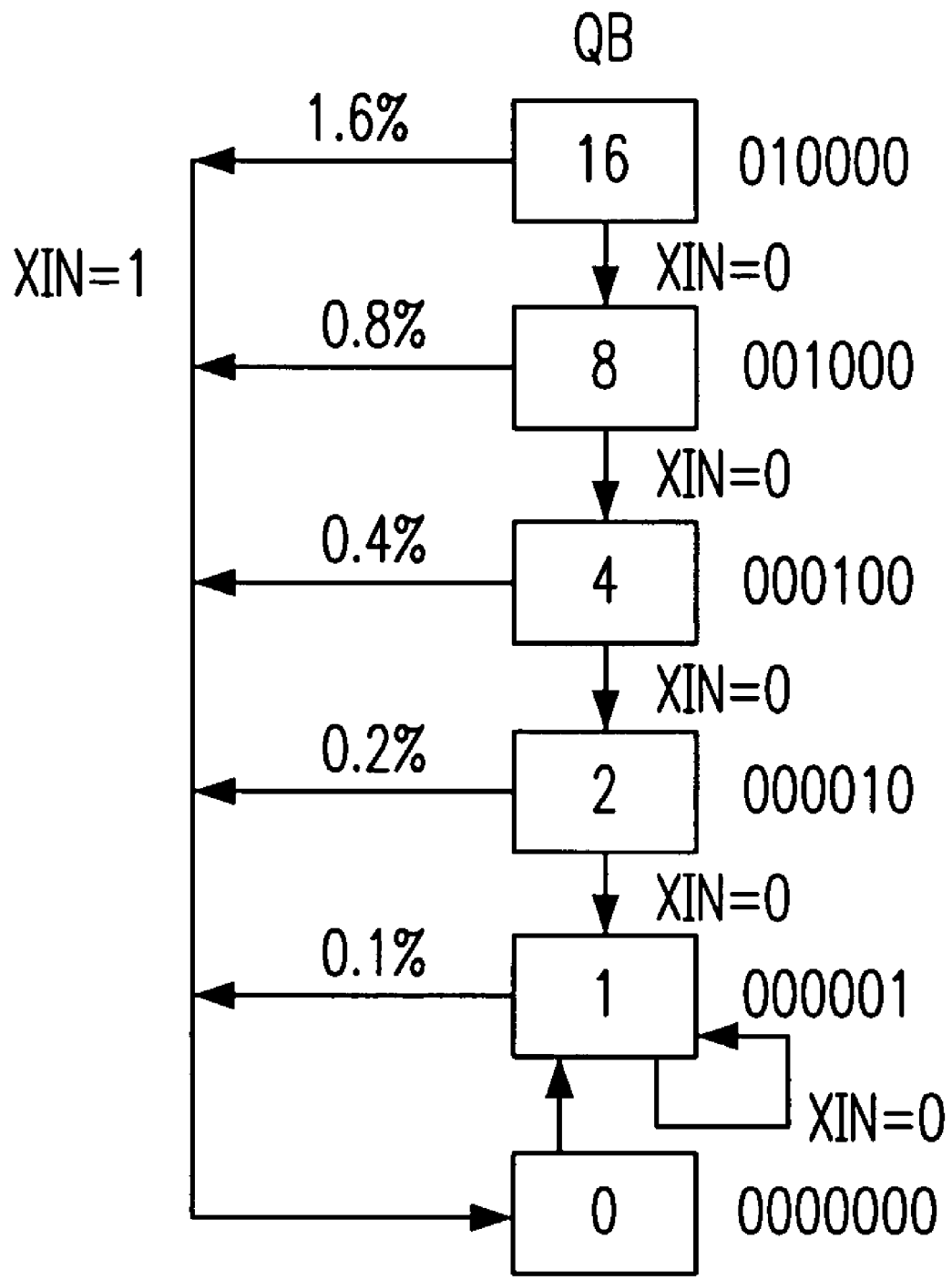
FIG. 6 is a schematic diagram showing a configuration of the ring counter according to the third embodiment of the present invention.

The ring counter 221 defines a set value of the frequency error rate of pre-variation, and FIG. 6 is a schematic diagram showing a configuration of the ring counter 221. When the ring counter 221 in FIG. 6 receives the information the identification value XIN is 0, the variation of the frequency error rate starts and the ring counter 221 can change a quantized value QB of an adjusting signal ADJ1 each time through setting. Therefore, the error rate of the frequency $f_{OSC}$ can be lowered step by step (1.6%→0.8%→0.4%→0.2%→0.1%) to make the known time interval $T_{FRAME}$ synchronized with the measured duration $T_{OSCDIV}$. In the meantime, if the frequency error rate is lowered to be within ±0.2%, the identification value XIN is changed as 1 and the quantized value QB can be skipped to 0 for stopping the adjustment of the frequency $f_{OSC}$. Besides, the ring counter 221 receives the identification value MIN and latches the identification value MIN for producing a quantized value MD of the adjusting signal ADJ1.

The addition-subtraction circuit 222 receives the control signal CA2 and the adjusting signal ADJ1 and changes the quantized value ACODE in the previous state according to the quantized value QB. The quantity of the change of the quantized value ACODE is determined by the quantized value QB, and the quantized value ACODE is increased or lowered is determined by the quantized value MD. After this manner, the addition-subtraction circuit 222 determines the quantized value QS being the change result of the quantized value ACODE and produces an adjusting signal ADJ2 having the quantized value QB. The latch 223 receives the adjusting signal ADJ2 and latches the quantized value QB for producing the control signal CA2 having the quantized value ACODE. The oscillator 13 receives the control signal CA2 and adjusts the frequency $f_{OSC}$ of the output signal OSC according to the quantized value ACODE. Because the configuration of the SAR adjusting circuit 22 is simple and clear, the area of the chip may be reduced.

The divider 26 has a frequency divisor FD2 and a buffer (not shown), receives the output signal OSC, and provides the signal having an accurate synchronizing frequency to a USB device or a MCU through frequency division. The control unit 25 controls the timing processor 21, the SAR adjusting circuit 22 and the divider 24 and coordinates the operation among the timing processor 21, the SAR adjusting circuit, 22, and the divider 24, wherein the operation includes the starting time of the oscillation adjusting circuit 93, the frequency division control of the divider 24, the access timing and the recovery control of signals among the respective components of the oscillation adjusting circuit 93, and ensuring the correctness of transmitting data.

Figure 7:
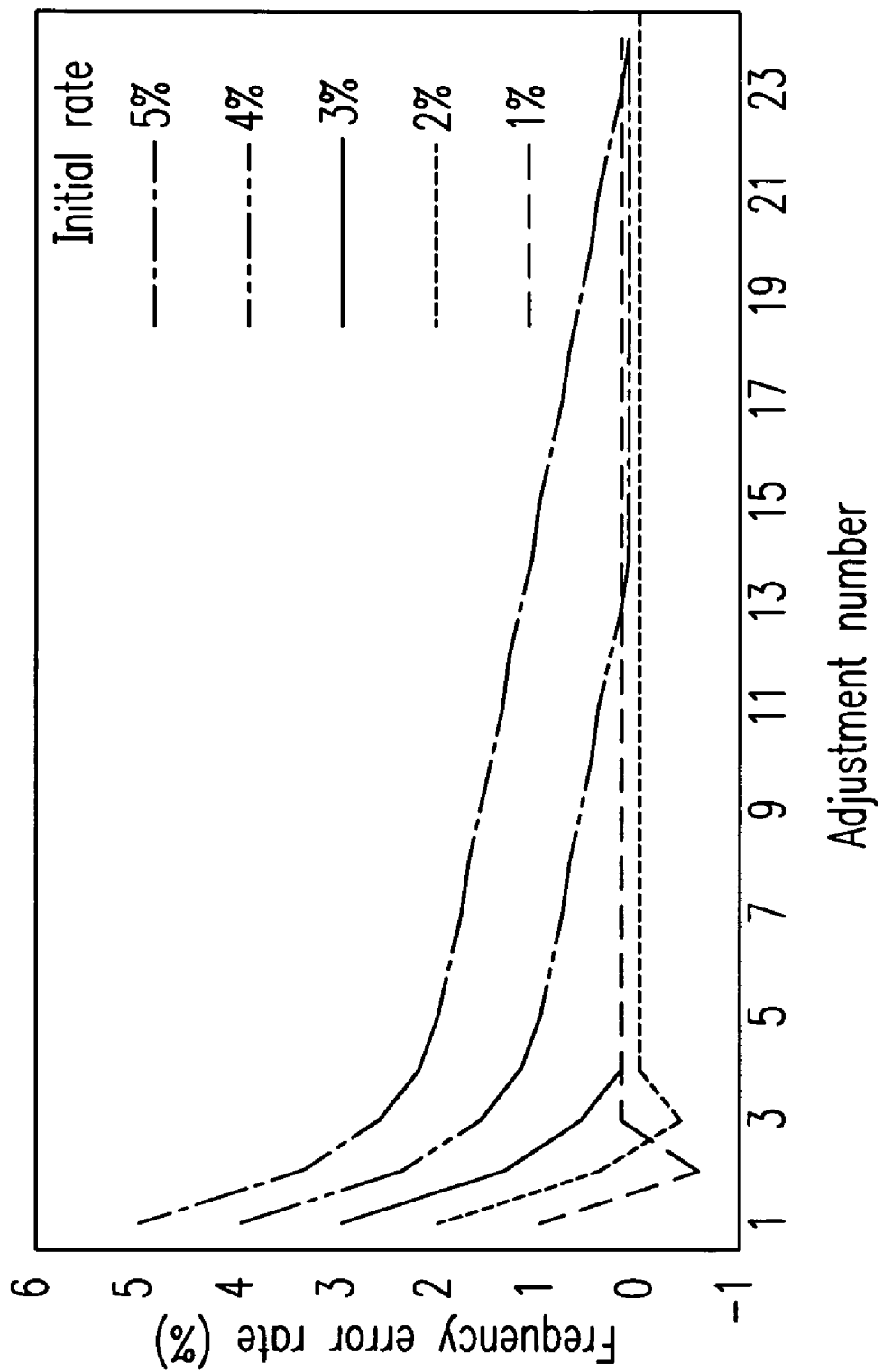
FIG. 7 is a schematic diagram showing a relation between a frequency error rate and an adjustment number according to the third embodiment of the present invention.

Therefore, the oscillation adjusting circuit 93 using the loop technique may calibrate the internal oscillation frequency of the receiver to be synchronized with the frequency of the USB transmitting terminal, and FIG. 7 shows the operation circumstances of the technique. In FIG. 7, the X-axis indicates the adjustment number, and the Y-axis indicates the frequency error rate (%), wherein the frequency error rate (%) is the error percentage between the frequency of the output signal CLK2 and the synchronizing frequency of the USB transmitting terminal. Each time the periodic event appears on the input data stream DATA2, the oscillation frequency of the oscillator 23 is adjusted and the frequency $f_{OSC}$ of the output signal OSC is corrected gradually, wherein it is unnecessary to count by higher clock frequency and to have a large lock-up table. Therefore, the power consumption and the error probability of the decision may be lowered. The synchronized frequency cannot drift. The system may be corrected whenever necessary and has higher stability. Under the same conditions, the present invention may also be applied to the synchronization locking of the clock. As the above example, the designer establishes the correlation, detects the error of the clock signal, and automatically corrects the magnitude of the frequency of the output clock, so that the data transmission of the system is more accurate in the process thereof.

In FIG. 7, if mass production is gone into, the initial oscillation frequency of the oscillator 23 cannot be corrected to the frequency with a lower frequency error rate; i.e., the initial frequency error rate is 4%, 5%, or above. Adjusting tens or twenties times may be required to make the frequency error rate lowered within 0.2%. Or, when the frequency error rate has been adjusted and locked to 0.2% and then is abruptly increased due to an external factor but does not want to be adjusted back too slowly, under the present circumstance, the configuration of the error comparator 212 and the ring counter 221 in FIG. 4 may be modified as follows.

Figure 8:
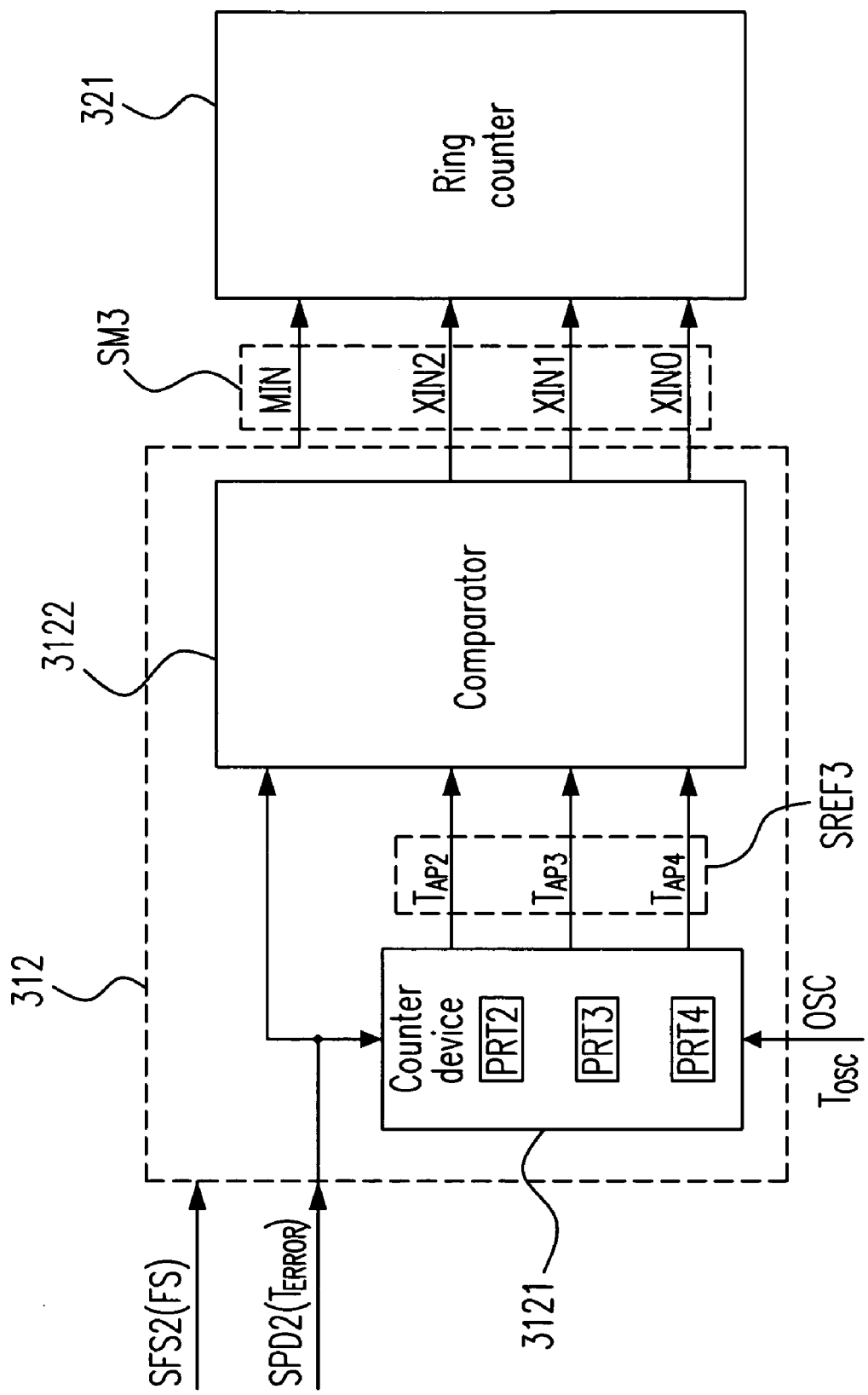
FIG. 8 is a schematic diagram showing another error comparator and another ring counter according to the third embodiment of the present invention.

Please refer to FIG. 8, which is a schematic diagram showing another error comparator 312 and another ring counter 321 according to the third embodiment of the present invention. As shown, the error comparator 312 includes a counter device 3121 and a comparator 3122. The counter device 3121 has three counting values PRT2, PRT3, and PRT4, receives the error time interval signal SPD2 and the output signal OSC, and produces a reference error signal SREF3 having three reference error time intervals $T_{AP2}$, $T_{AP3}$, and $T_{AP4}$ according to the counting values PRT2, PRT3, and PRT4, the output signal OSC, and a starting time point of the error time interval $T_{ERROR}$. The comparator 3122 compares the error time interval $T_{ERROR}$ with the reference error time intervals $T_{AP2}$, $T_{AP3}$, and $T_{AP4}$ for producing a comparison result signal SM3.

An example with practical data is given. The counting values PRT2, PRT3, and PRT4 are set as 360, 120, and 24 respectively. The reference error time interval $T_{AP2}$ may have the value of 30 μs ($T_{AP2}=T_{OSC}\cdot 360$), which indicates a maker point of 3% (30μ/1 m). The reference error time interval $T_{AP3}$ may have the value of 10 μs ($T_{AP3}=T_{OSC}\cdot 120$), which indicates a maker point of 1% (10μ/1 m). The reference error time interval $T_{AP4}$ may have the value of 2 μs ($T_{AP4}=T_{OSC}\cdot 24$), which indicates a maker point of 0.2% (2μ/1 m). Therefore, if the error time interval $T_{ERROR}$ is longer than the reference error time interval $T_{AP2}$, it is indicated that the current frequency error rate is larger than 3% (XIN2=0). If the error time interval $T_{ERROR}$ is longer than the reference error time interval $T_{AP3}$, it is indicated that the current frequency error rate is larger than 1% (XIN1=0). Consequently, three identification values XIN2, XIN1, and XIN0 of the comparison result signal SM3 may be determined, and the truth table of the identification values XIN2, XIN1, and XIN0 is shown in Table 2 as follows.

TABLE 2

| XIN2 | XIN1 | XIN0 | Frequency error rate |
|---|---|---|---|
| 0 | 0 | 0 | >3% |
| 0 | 0 | 1 | X |
| 0 | 1 | 0 | X |
| 0 | 1 | 1 | X |
| 1 | 0 | 0 | 1~3% |
| 1 | 0 | 1 | X |
| 1 | 1 | 0 | 0.2~1% |
| 1 | 1 | 1 | <0.2% |

As the truth table in Table 2 is ready, the current range of the frequency error rate may be obtained. Therefore, the error comparator 312 produces the comparison result signal SM3 having the identification values XIN2, XIN1, and XIN0 provided to the ring counter 321. Under the present circumstance, it is necessary to suitably modify the ring counter 321 in a manner similar to FIG. 6. Suppose that there is XIN2 XIN1 XIN0=000, which indicates that the current frequency error rate is larger than 3% and may be configured to be adjusted with a large adjusting extent (e.g. the adjustment of 2%). Suppose that there is XIN2 XIN1 XIN0=100, which indicates that the current frequency error rate is within a range of 1~3% and may be configured to be adjusted with a mediate adjusting extent (e.g. the adjustment of 0.5% or 1%). The rest may be deduced by analogy. The designer may set the magnitude of the frequency error rate of the pre-variation by himself to solve the problem the adjusting time may be too long for increasing the system efficiency.

Figure 9:
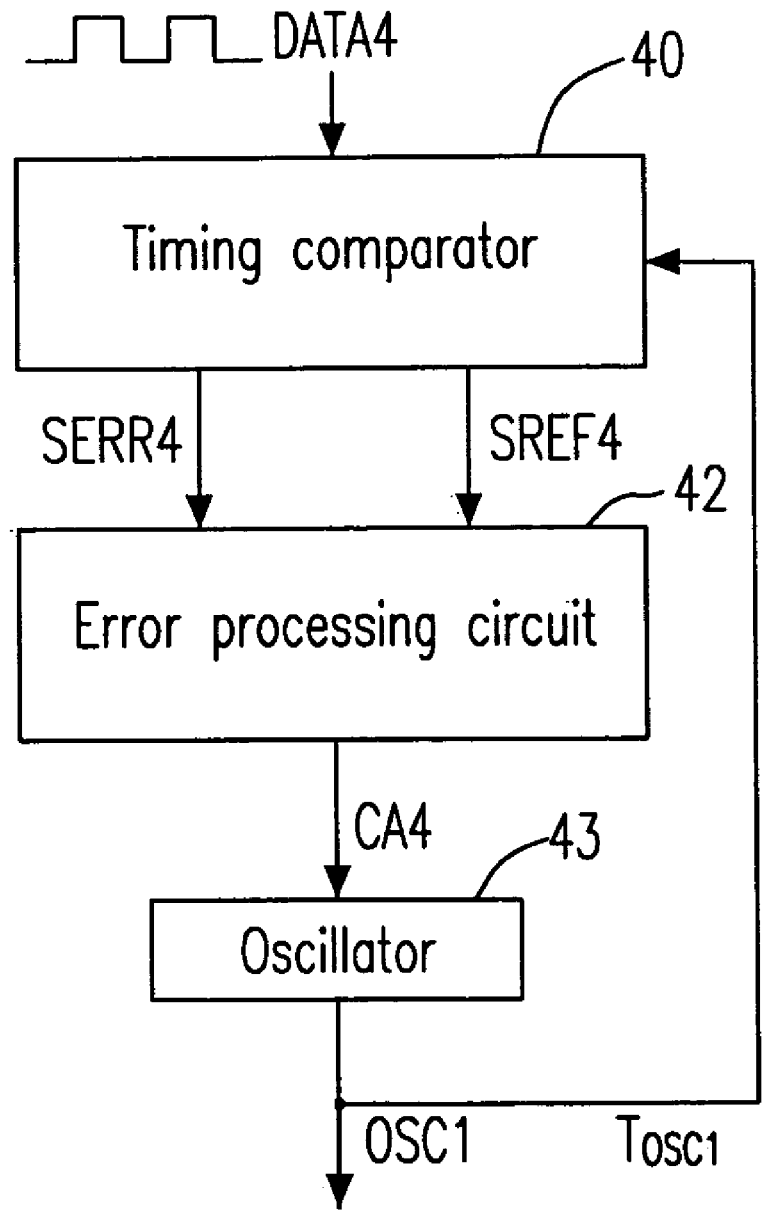
FIG. 9 is a schematic diagram showing an oscillation adjusting circuit according to the fourth embodiment of the present invention.

Please refer to FIG. 9, which is a schematic diagram showing an oscillation adjusting circuit according to the fourth embodiment of the present invention. As shown, the oscillation adjusting circuit 94 includes an oscillator 43, a timing comparator 40, and an error processing circuit 42. The oscillator 43 produces an output signal OSC1 having a first period $T_{OSC1}$. The timing comparator 40 receives the output signal OSC1 and an input data stream DATA4 with a known time interval, produces an error signal SERR4 representing a difference between the known time interval and a measured duration of the known time interval, and produces a reference error signal SREF4 according to a predetermined multiple of the period $T_{OSC1}$, wherein the known time interval is associated with a period between a first occurrence of and a second occurrence of a predetermined bit pattern in the input data stream DATA4. The error processing circuit 42 receives the error signal SREF4 and the reference error signal SERR4 and produces a control signal CA4 adjusting the period $T_{OSC1}$ according to the error signal SREF4 and the reference error signal SERR4.

Here, please refer to FIG. 9 and an oscillation adjusting method of the present invention for producing an output signal OSC1 having a period $T_{OSC1}$ is depicted. The method includes the following steps. An input data stream DATA4 with a known time interval is provided, wherein the known time interval is associated with a period between a first occurrence of and a second occurrence of a predetermined bit pattern in the input data stream DATA4. An error signal SERR4 representing a difference between the known time interval and a measured duration of the known time interval is determined. A reference error signal SREF4 is determined according to a predetermined multiple of the period $T_{OSC1}$. And, the period $T_{OSC1}$ is adjusted according to the error signal SERR4 and the reference error signal SREF4.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An oscillation adjusting circuit, comprising:
   an oscillator producing an output signal having a first period;
   a timing comparator receiving the output signal and an input data stream with a known time interval, producing a feedback signal with a first duration according to the known time interval and the first period, producing a first error signal representing a difference between the known time interval and the first duration, and counting a predetermined multiple of the first period to produce a reference error signal having a reference error time interval by being triggered by the first error signal, wherein the known time interval is associated with a period between a first occurrence of and a second occurrence of a predetermined bit pattern in the input data stream; and
   an error processing circuit receiving the first error signal and the reference error signal and producing a control signal adjusting the first period according to the first error signal and the reference error signal.

2. An oscillation adjusting method for producing a first output signal having a first period, comprising steps of:
   providing an input data stream with a known time interval, wherein the known time interval is associated with a period between a first occurrence of and a second occurrence of a predetermined bit pattern in the input data stream;
   producing a feedback signal with a first duration according to the known time interval and the first period;
   determining a first error signal representing a difference between the known time interval and the first duration;
   determining a reference error signal according to a predetermined multiple of the first period;
   counting the predetermined multiple of the first period of the first output signal to produce the reference error signal having a reference error time interval by being triggered by the first error signal; and
   adjusting the first period according to the first error signal and the reference error signal.

3. An oscillation adjusting method according to claim 2, further comprising steps of:
   producing a comparison result signal according to the first error signal and the reference error time interval;
   producing a control signal according to the comparison result signal and a binary search operation;
   oscillating to produce the first output signal according to the control signal;
   producing the feedback signal being a frequency division signal according to the first output signal, a first frequency divisor, and the first occurrence of the predetermined bit pattern;
   producing a second output signal according to the first output signal and a second frequency divisor; and
   determining a first starting and a first ending time points of the known time interval and a second starting and a second ending time points of the first duration for producing the first error signal by detecting pulse edges of the input data signal and pulse edges of the frequency division signal, wherein the first error signal comprises a first error time interval and a fast-slow relation value.

4. An oscillation adjusting method according to claim 3, further comprising a step of:
   determining the first frequency divisor according to the first period and the known time interval.

5. An oscillation adjusting method according to claim 3, wherein:
   the known time interval is a period between a pair of SOF packets; and
   the first error time interval is a period between the first ending time point and the second ending time point.

6. An oscillation adjusting method according to claim 2, wherein the first error signal comprises a first error time interval and a fast-slow relation value, and the method further comprises steps of:
   determining a plurality of additional error time intervals according to a starting time point of the first error time interval and a plurality of additional predetermined multiples of the first period, wherein the plurality of additional reference error time intervals correspond to the plurality of additional predetermined multiples respectively; and
   determining an adjusting extent for the first period by comparing the first error time interval with the plurality of additional reference error time intervals.

7. An oscillation adjusting circuit, comprising:
   a first circuit comprising an oscillator and a timing comparator receiving an input data stream with a known time interval, producing a first output signal having a first period, producing a feedback signal with a first duration according to the known time interval and the first period, determining a first error signal representing a difference between the known time interval and the first duration, counting a predetermined multiple of the first period to produce a reference error signal having a reference error time interval by being triggered by the first error signal, and adjusting the first period according to the first error signal and the reference error signal, wherein the known time interval is associated with a period between a first occurrence of and a second occurrence of a predetermined bit pattern in the input data stream.

8. An oscillation adjusting circuit according to claim 7, wherein:
the input data stream further comprises at least another known time interval; and
a first frequency is a reciprocal of the first period, and the first frequency is adjusted to be within 0.25% of a host data rate.

9. An oscillation adjusting circuit according to claim 8, wherein the known time intervals are delimited by periodic events in the input data stream.

10. An oscillation adjusting circuit according to claim 9, wherein the periodic events comprise start-of-frame (SOF) packets of a Universal Serial Bus (USB) protocol.

11. An oscillation adjusting circuit according to claim 7, wherein the first circuit comprises:
the oscillator producing the first output signal;
the timing comparator receiving the first output signal and the input data stream, determining the first error signal, determining the reference error signal, and producing a comparison result signal according to the first output signal, the first error signal, and the reference error signal; and
an error adjusting circuit receiving the comparison result signal, and producing a control signal controlling the oscillator according to the comparison result signal.

12. An oscillation adjusting circuit according to claim 11, wherein:
the timing comparator comprises:
a control unit;
an error comparator coupled to the control unit, controlled by the control unit, having the predetermined multiple, receiving the first output signal and the first error signal, triggered by the first output signal for counting the predetermined multiple to produce the reference error signal, and producing the comparison result signal;
a divider coupled to the control unit, controlled by the control unit, having a frequency divisor, receiving the first output signal, and producing the feedback signal being a frequency division signal according to the first output signal, the frequency divisor, and the first occurrence of the predetermined bit pattern; and
an edge detector coupled to the control unit, controlled by the control unit, receiving the input data stream and the frequency division signal, detecting pulse edges of the input data stream and pulse edges of the frequency division signal, determining a first starting and a first ending time points of the known time interval and a second starting and a second ending time points of the first duration for producing the first error signal, wherein the first error signal comprises a first error time interval and a fast-slow relation value; and
the error adjusting circuit comprises:
a successive approximation register (SAR) adjusting circuit coupled to the control unit, controlled by the control unit, receiving the comparison result signal, and producing a control signal controlling the oscillator according to the comparison result signal.

13. An oscillation adjusting circuit according to claim 12, wherein the error comparator further comprises:
a counter device having the predetermined multiple, receiving the first error signal and the first output signal, and producing the reference error signal according to the predetermined multiple, the first output signal, and a third starting time point of the first error time interval; and
a first comparator comparing the reference error time interval with the first error time interval, wherein when the first error time interval is longer than the reference error time interval, the SAR adjusting circuit adjusts the oscillator for making the first error time interval shorter than the reference error time interval.

14. An oscillation adjusting circuit according to claim 12, wherein the edge detector detects the predetermined bit pattern in the input data stream.

15. An oscillation adjusting circuit according to claim 14, wherein the edge detector detects an SOF packet.

16. An oscillation adjusting circuit according to claim 12, wherein:
the frequency divisor is determined according to the first period and the known time interval; and
the first error time interval is a period between the first ending time point and the second ending time point.

17. An oscillation adjusting circuit according to claim 12, wherein the SAR adjusting circuit comprises:
a ring counter receiving the comparison result signal and producing a first adjusting signal according to the comparison result signal;
an addition-subtraction circuit receiving the control signal and the first adjusting signal and utilizing the first adjusting signal to adjust the control signal for producing a second adjusting signal; and
a latch receiving the second adjusting signal and latching the second adjusting signal for producing the control signal.

18. An oscillation adjusting circuit according to claim 11, wherein the first circuit further comprises:
a divider having a frequency divisor, receiving the first output signal, and producing a second output signal according to the first output signal and the frequency divisor.

19. An oscillation adjusting circuit according to claim 7, wherein:
the first error signal comprises a first error time interval and a fast-slow relation value;
the first circuit further determines a plurality of additional reference error time intervals according to a starting time point of the first error time interval and a plurality of additional predetermined multiples of the first period, wherein the plurality of additional reference error time intervals correspond to the plurality of additional predetermined multiples respectively; and
the first circuit compares the first error time interval with the plurality of additional reference error time intervals for determining an adjusting extent for the first period.

20. An oscillation adjusting circuit according to claim 19, wherein:
the first circuit comprises a counter device; and
the counter device has the plurality of additional predetermined multiples, receives the first error signal and the reference error signal, and produces the plurality of additional reference error time intervals according to the plurality of additional predetermined multiples, the first output signal, and a starting time point of the first error time interval.

* * * * *